United States Patent
Lagunas

(10) Patent No.: US 11,101,819 B2
(45) Date of Patent: Aug. 24, 2021

(54) COMPRESSION OF SEMI-STRUCTURED DATA

(71) Applicant: PAYPAL, INC., San Jose, CA (US)

(72) Inventor: Diego Lagunas, Cupertino, CA (US)

(73) Assignee: PAYPAL, INC., San Jose, CA (US)

( * ) Notice: Subject to any disclaimer, the term of this patent is extended or adjusted under 35 U.S.C. 154(b) by 904 days.

(21) Appl. No.: 15/637,604

(22) Filed: Jun. 29, 2017

(65) Prior Publication Data

US 2019/0007059 A1 Jan. 3, 2019

(51) Int. Cl.
*G06F 16/00* (2019.01)
*H03M 7/30* (2006.01)
*G06F 16/80* (2019.01)
*G06F 16/81* (2019.01)
*G06F 16/174* (2019.01)

(52) U.S. Cl.
CPC ........ *H03M 7/707* (2013.01); *G06F 16/1744* (2019.01); *G06F 16/80* (2019.01); *G06F 16/81* (2019.01); *H03M 7/30* (2013.01); *H03M 7/3088* (2013.01); *H03M 7/3091* (2013.01)

(58) Field of Classification Search
CPC .... G06F 16/1744; G06F 16/81; G06F 16/215; G06F 16/22
See application file for complete search history.

(56) References Cited

U.S. PATENT DOCUMENTS 9,407,727 B1 * 8/2016 McCanne ................ H04L 67/34
9,507,848 B1 * 11/2016 Li ............................ G06F 16/31
2002/0120598 A1 * 8/2002 Shadmon .............. G06F 16/835
2014/0244604 A1 * 8/2014 Oltean ................ H03M 7/3091
                                                                707/693
2018/0129696 A1 * 5/2018 Bensberg ................ G06F 16/93

OTHER PUBLICATIONS

Barg, Michael, and Raymond K. Wong. "A fast and versatile path index for querying semi-structured data." Eighth International Conference on Database Systems for Advanced Applications, 2003. (DASFAA 2003). Proceedings . . . IEEE, 2003.*
Ottaviano, Giuseppe, and Roberto Grossi. "Semi-indexing semi-structured data in tiny space." Proceedings of the 20th ACM international conference on Information and knowledge management. 2011.*
Akkok, Naci, et al. "Semi-Structured Data and XML" [Online]. [retrieved on Jun. 16, 2017]. Retrieved from the Internet: <URL: https://pdfs.semanticscholar.org/a3ae/8f19048033ceaf7021c4f85b28970548b971.pdf>.

(Continued)

*Primary Examiner* — Nan Hutton
(74) *Attorney, Agent, or Firm* — Haynes and Boone, LLP

(57) ABSTRACT

A method for compressing semi-structured data is discussed. The method includes accessing semi-structured data, the semi-structured data comprising a plurality of elements. The method includes determining a plurality of unique elements of the plurality of elements, each of the plurality of unique elements associated with a respective unique index of a plurality of unique indexes. Each of the unique index can indicate a position in one of a plurality of data stores. The method includes generating a sequence of encoded representations corresponding to the plurality of elements, the generating based on the plurality of unique indexes.

20 Claims, 4 Drawing Sheets

(56) References Cited

OTHER PUBLICATIONS

Alom, B. M. Monjurul "Querying Semistructured Data with Compression in Distributed Environments" [Online]. ResearchGate [retrieved on Jun. 16, 2017]. Retrieved from the Internet: <URL: https://www.researchgate.net/publication/220841655>, Jan. 2009.
Adiego, Joaquin, et al. "Using Structural Contexts to Compress Semistructured Text Collections" Information Processing & Management, vol. 43, Issue 3, May 2007 [retrieved on Jun. 16, 2017]. Retrieved from the Internet: <URL: https://www.dcc.uchile.cl/~gnavarro/ps/ipm06.pdf>, p. 769-790.
Nevill-Manning, Craig, et al. "Compressing semi-structured text using hierarchical phrase identification" [Online]. In Data Compression Conference (DCC '96), Snowbird, Utah, Mar. 31-Apr. 3, pp. 63-72. California, USA: IEEE Computer Society Press [retrieved on Jun. 16, 2017]. Retrieved from the Internet: <URL: http://researchcommons.waikato.ac.nz/handle/10289/4835>, 1996.
Unknown "Semi-structured data" [Online]. Wikipedia [retrieved on Jun. 16, 2017]. Retrieved from the Internet: <URL: https://en.wikipedia.org/wiki/Semistructured_data>.

\* cited by examiner

COMPRESSION OF SEMI-STRUCTURED DATA

TECHNICAL FIELD

Embodiments of the present disclosure generally relate to the field of data storage and, more particularly, to techniques for data compression and decompression.

BACKGROUND

Data can be stored and accessed using several different techniques, including as structured data, as semi-structured data, and as unstructured data. Structured data is typically stored and accessed using schema (e.g., data models). The data models can define how the data is organized such as via data fields, values, types. Structured data can be stored using databases, such by relational databases, in rows and columns based on the data models. Structured data can be managed and accessed using structured query language (SQL) or other database programming languages.

Unstructured data includes data that is not organized, and is not stored using a database. Examples of unstructured data are text and multimedia content, videos, photos, etc. Although unstructured data can have some structure (e.g., can conform to a structured video format), the data itself may not fit into a database, and it may not be otherwise organized.

Semi-structured data refers to information that has some organizational properties but is not stored using a database. Semi-structured data can have meta-tags or some other identifiers that identify the data, but the data is not structured, and it does not fit any schema. Examples of semi-structured data is data stored using eXtensible Markup Language (XML) and JavaScript Object Notation (JSON). Semi-structured data facilitates storage and access of collections of data in a logical manner. However, the storage and access of semi-structured data can be inefficient.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

The description that follows includes exemplary systems, methods, techniques, instruction sequences, and computer program products that embody techniques of the present disclosure. However, it is understood that the described embodiments may be practiced without these specific details. For instance, although some examples refer to certain data types and formats, as well as certain arrangement of data in data stores, variations of the described examples are contemplated.

Semi-structured data refers to information that has some organizational properties but is not stored using a database. Semi-structured data can be identified using meta-tags or some other identifiers, but the data itself is not structured. Semi-structured data also does not fit database schema. Examples of semi-structured data is data stored using eXtensible Markup Language (XML) and JavaScript Object Notation (JSON). Semi-structured data facilitates storage and access of collections of data in a logical manner.

The following disclosure discusses methods and systems for compressing semi-structured data. The semi-structured data can comprise a plurality of elements. The method for compressing semi-structured data can include accessing semi-structured data, such as to compress data that is already stored, or to compress received uncompressed data. The method includes determining a plurality of unique elements of the plurality of elements, each of the plurality of unique elements associated with a respective unique index of a plurality of unique indexes. The method can use several data stores, each of the data stores for storing a different portion of compressed semi-structured data. Each of the unique indexes can indicate a position of an element or of an encoded representation in one of the data stores.

The method can include generating a sequence of encoded representations corresponding to the plurality of elements of the semi-structured data, the generating the sequence of encoded representations based on the plurality of unique indexes. The method can include serializing the sequence of encoded representations, such as by generating a compressed file that comprises a plurality of encoded representations of the plurality of indexes mapped into the plurality of data stores. The following description, and associated Figures, illustrates various embodiments directed to the ideas listed above.

Figure 1:
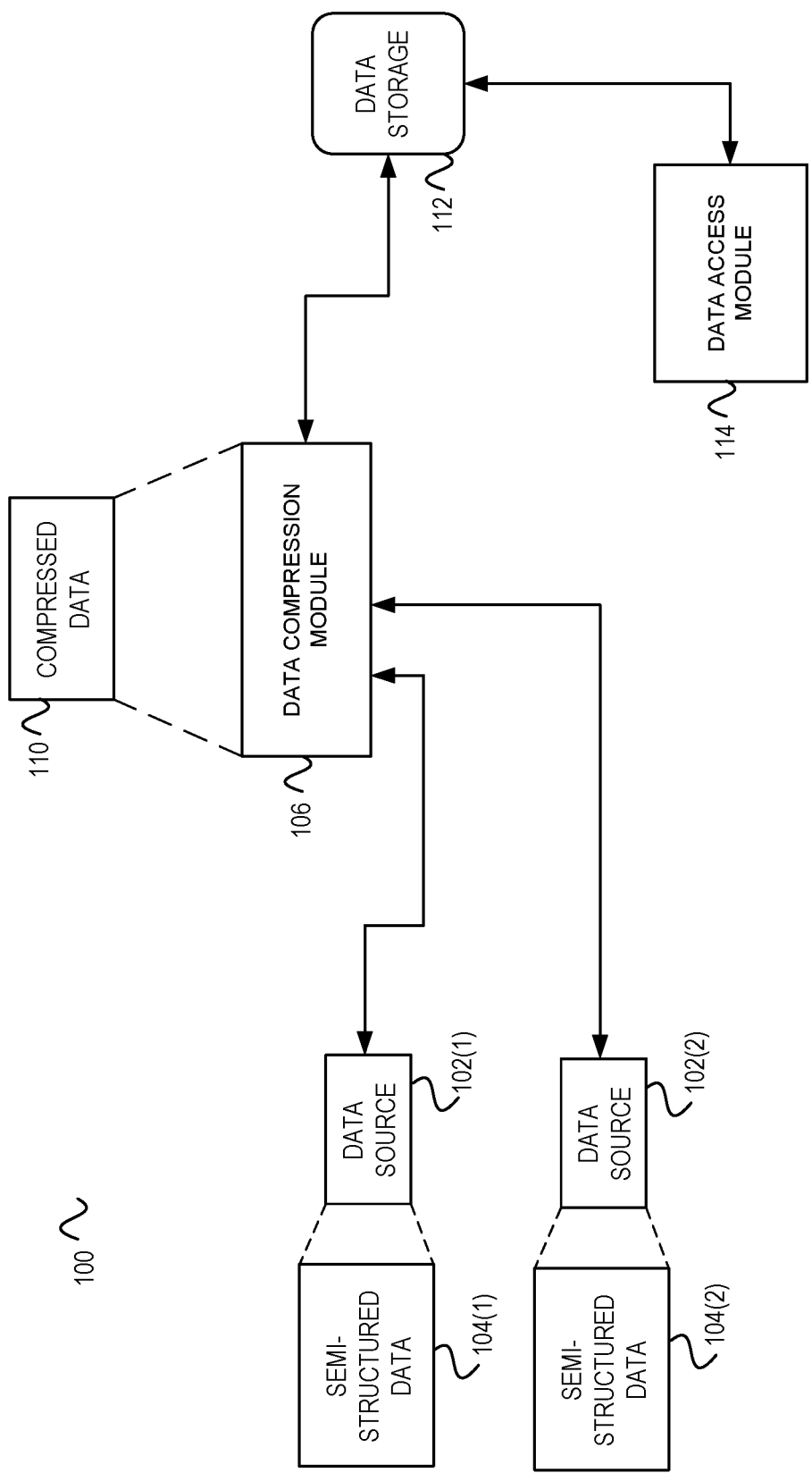
FIG. 1 is a system diagram illustrating embodiments of a data storage system showing a data compression module for compressing semi-structured data.

FIG. 1 is a system diagram illustrating embodiments of a data storage system showing a data compression module for compressing semi-structured data. In an overview of the system diagram 100, data sources 102(1) and 102(2) (referred to collectively as data sources 102) can be accessed by a data compression module 106. The data sources 102(1) and 102(2) can store and/or provide semi-structured data 104(1) and 104(2) (referred to collectively as semi-structured data 104). The data compression module 106 can compress the semi-structured data 104. The data compression module 106 can then store the compressed data at data storage 112. A data access system 114 can access the compressed data at the data storage 112.

Depending on the embodiments, several variations of the above data compression scheme are contemplated. For example, the data compression module 106 can access locally stored semi-structured data instead of receiving the semi-structured data 104 from the data source 102. The data compression module 106 can also provide the compressed data to the data access system 114 directly, i.e., without using the data storage 112. The data compression module 106 can compress semi-structured data in batches of data received from the data sources 102. It is noted that one or more of the elements shows in the system diagram 100 can be combined or distributed. For example, one or more of the data sources 102, the data compression module 106, the data storage 112, and the data access system 114 can be hosted by a single server, or by a group of servers. Similarly, one or more of the data sources 102, the data compression module 106, the data storage 112, and the data access system 114 can be distributed across one or more networks, or implemented via cloud computing.

The data compression module 106 can access the semi-structured data 104 via the data sources 102. The semi-structured data 104 can be stored at the data sources 102. The data sources 102 can provide, to the data compression module 106, the semi-structured data 104 at certain intervals or in continuous manner. The data compression module 106 can perform the compression in several steps, which include determining unique elements of the semi-structured data 104, where each unique element is associated with a respective unique index. Each of the unique indexes can indicate a position in one of data stores. Each of the data stores (e.g., data repositories) can be used to store a different portion of compressed semi-structured data, and/or of elements used in the compression process. The data compression module 106 can generate a sequence of encoded representations that corresponds to the plurality of elements of the semi-structured data. Generation of sequence of encoded representations can be based on the plurality of unique indexes.

The sequence of the encoded representations (and optionally of at least some of the data stores) can then be serialized to generate compressed data. The compressed data can be stored by the data storage 112. The data compression steps described herein can be performed by the data compression module 106 in a sequential manner. In some embodiments, the data compression module 106 can perform at least a portions of these steps in a parallel manner, such as using pipelining techniques.

It is noted that a service or an application (such as a module that implements the functionality of the data compression module 106) can be hosted by a combination of software and hardware. It is noted that the same term "hosting" is used herein to describe both software hosting and hardware hosting. When software hosting, a software service can instantiate and manage multiple data compression modules. When hardware hosting, a computing device (such as a server or a user device) can provide resources such as memory, communication, and execution resources for execution of instructions.

Figure 2:
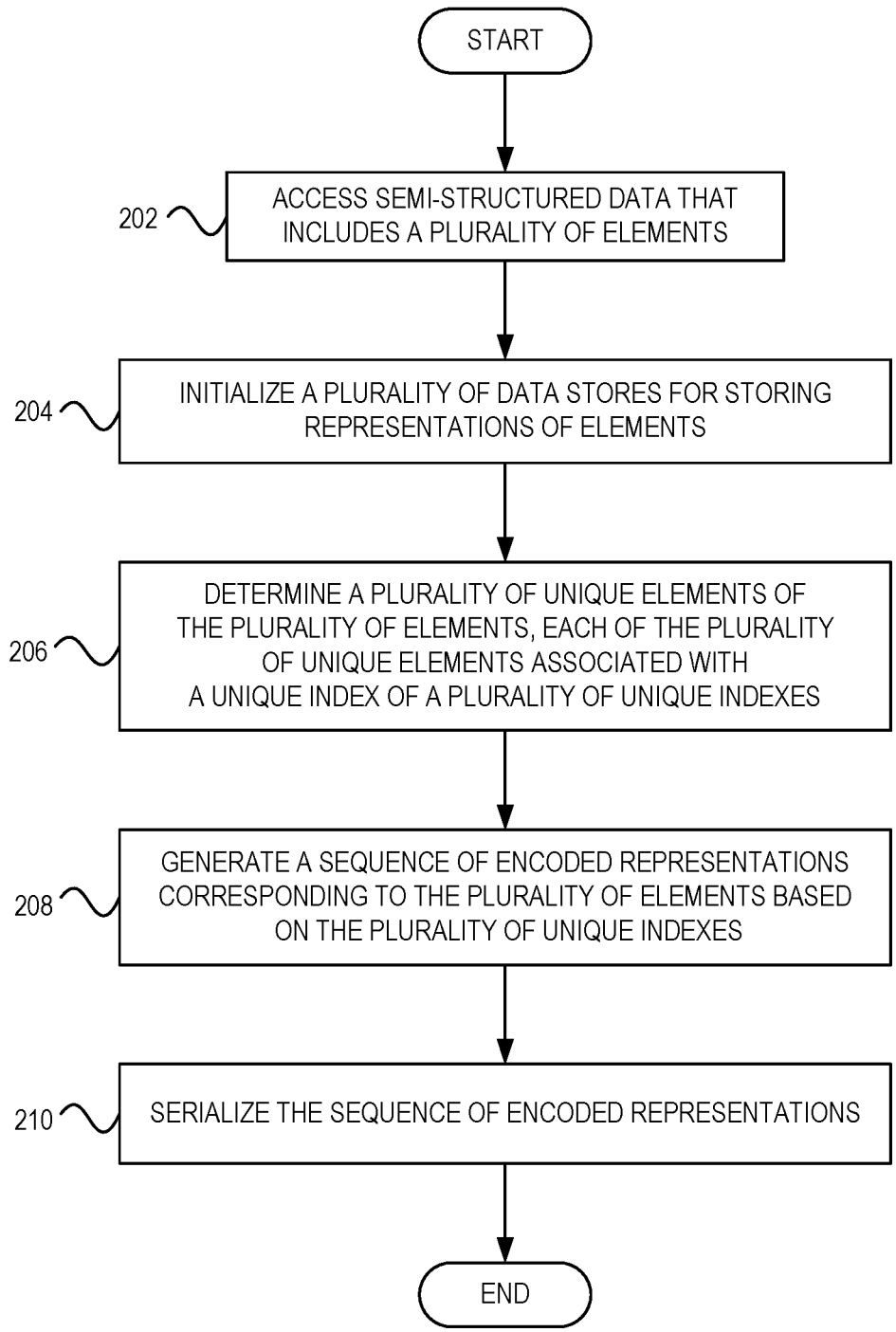
FIG. 2 is a flow diagram illustrating embodiments of operations for compressing semi-structured data.

FIG. 2 is a flow diagram illustrating embodiments of operations for compressing semi-structured data. The method of FIG. 2 is described with reference to the systems and components described in FIG. 1 (for illustration purposes and not as a limitation). The example operations can be carried out by the data compression module 106.

Beginning with 202, the data compression module accesses semi-structured data. The semi-structured data includes a plurality of elements, such as collections of data. The semi-structured data can be implemented using XML data and/or JSON data. An example that shows JSON data, and how it is compressed using the methods of this disclosure, is described below with reference to FIG. 3. The semi-structured data can be accessed and processed all at once, or in batches. For example, the data compression module can perform the method of FIG. 2 for stored data to generate a compressed file, and then perform operations on batches of additional semi-structured data that is received from the data source after the compressed file is generated.

At 204, the data compression module initializes a plurality of data stores for storing representations of elements. Each of the plurality of data stores is associated with a different type of element. A data store can be implemented as a data structure that can store and provide access to various data, such as key data pairs. A data store can be implemented as a data repository, which may have some data structure such as indexing of data elements. The data store can be accessed via an index and/or a pointer that specifies a location in the data store. The data store(s) can be hosted by the data compression module, or they can be hosted in a cloud. The data compression module can initialize the data stores, which can include creating new data structure(s), allocating memory and/or other resources, and/or setting initial value(s). However, in some embodiments, the data stores can be initialized prior to 204 (or prior to 202).

In some embodiments, the data compression module can implement a separate data store for each data type. For example, the data compression module can implement one data store for atomic elements (e.g., semi-structured data elements that do not comprise and/or point to other semi-structured data elements), another data store for object elements (e.g., semi-structured data elements that comprise and/or point to other semi-structured data elements), and yet another data store for array elements (e.g., semi-structured data elements that are a sequence of other semi-structured data elements). In other embodiments, the data compression module can implement a single data store that combines multiple data types. In this implementation, the single data store can separate different types of data, such as by using different index ranges. Furthermore, access and compression of other data types, in addition the data types described herein, is contemplated.

At 206, the data compression module determines a plurality of unique elements of the plurality of elements, each of the plurality of unique elements associated with a respective unique index of a plurality of unique indexes. Determining the plurality of unique elements can include storing a respective unique index or a reference to the respective unique index for each of the elements in a corresponding data store. The data compression module can access each of the elements of the semi-structured data (of element 202) and generate a unique index for each unique element. Thus, if an accessed element is already associated with a unique index, the data compression module does not associate another unique index for this duplicative element. The data compression module can access the semi-structured data (of element 202) sequentially, or in a predetermined order. Each respective unique index can indicates an index into a respective data store. For example, a first unique index can indicates a first type of element and an index into a first data store of the plurality of data stores.

At 208, the data compression module generates a sequence of encoded representations corresponding to the plurality of elements based on the plurality of unique indexes. Each of the encoded representations can be implemented using a character encoding, such as by using Unicode characters (e.g., UTF-8 (8-bit Unicode Transformation Format), UTF-16 (16-bit Unicode Transformation Format)), UCS-2 (2-byte Universal Character Set)), or ISO/IEC 10646, among others. Example encoded representations are described below with reference to FIG. 3.

At 210, the data compression module 106 serializes the sequence of encoded representations. In some embodiments, serializing the plurality of elements can include generating a compressed file that includes encoded representations of the indexes mapped into the data stores. Serializing the plurality of elements can include de-duplicating the compressed file to obtain de-duplicated compressed file that includes de-duplicate representations. The data compression module can also create a root pointer to the compressed file, where the root pointer can be accessible from one of the plurality of data stores. In one embodiment, the root pointer can point to the sequence of encoded representations. The compressed file can be transmitted and/or stored, potentially achieving large improvements in storage and/or transmission efficiency of semi-structured data.

The compressed file can then be decompressed by a decompression module, which can include de-serializing the data store(s). The decompression process can access a first element of the sequence of the encoded representations by using the root pointer. The decompression can then be performed on the subsequent elements. During the decompression process, the decompression module can create new array(s) or new object(s) based on contents of the accessed elements of the sequence of the encoded representations. If the accessed element in the sequence of the encoded representations is an atomic element, that atomic element can be used as a semi-structured data element, without creation of other data types.

FIGS. 3A-3C illustrate an example of compression of semi-structured data. With reference to FIG. 2, the data compression module can access the semi-structured data 302 at 202. FIG. 3A illustrates semi-structured data 302, which can be an example of semi-structured data 104(1) and/or 104(2) of FIG. 1. The semi-structured data can be implemented using JSON. The semi-structured data 302 includes elements 312-325. The elements 312-325 are grouped in key-value pairs, such as elements 312 (key) and 313 (value), 314 (key) and 315 (value), 316 (key) and 317 (value), 318 (key) and 319 (value), 320 (key) and 321 (value), 322 (key) and 323 (value), and 324 (key) and 325 (value).

Elements 312-317 can be grouped together as atomic key-value pairs 304. Thus, for the key-value pair 312 and 313, a key of a is associated with an atomic value of 123. Elements 318-321 can be grouped together as object key-value pairs at 306. Thus, for the key-value pair of 318 and 319, a key of d is associated with an object of [123, 'foo', 'bar']. Elements 322-325 can be grouped together as array key-value pairs at 308. Thus, for the key-value pair of 322 and 323, a key of g is associated with an array of {a: 123}. However, use and/or representation of other data types are contemplated.

Figure 3:
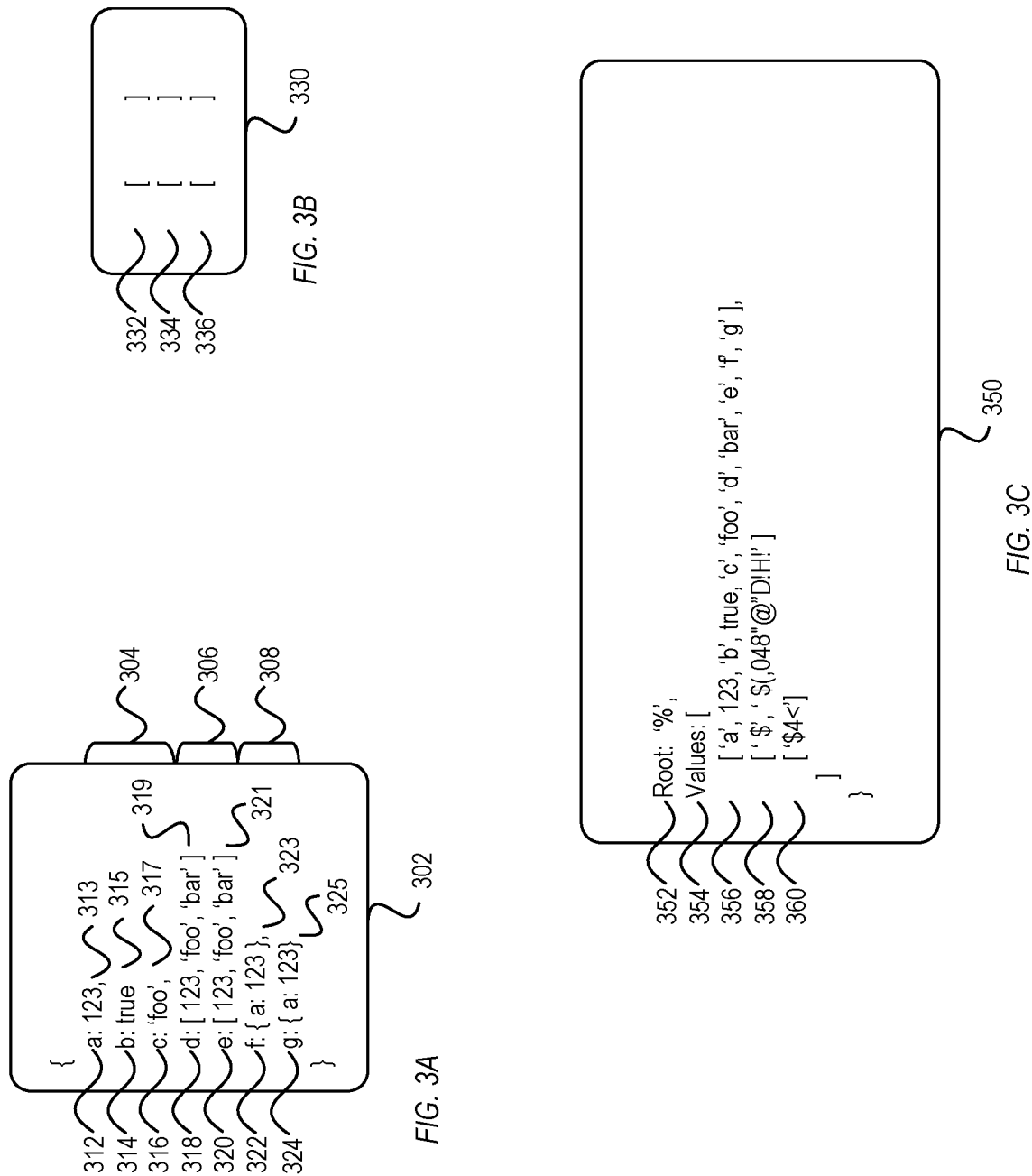
FIGS. 3A-3C illustrate an example of compression of semi-structured data.

FIG. 3B illustrates initialized data stores 332-336. In the example shown in FIG. 3, there are three data stores 332-336, can be referred to together as a single data store 330. The data store 332 can store elements of an atomic type, the data store 334 can store elements of an object type, and the data store 336 can store elements of an array type. It is noted that although FIG. 3B illustrates 3 data stores, a different number of data stores can be used. The type of data stored at the data stores 332-336 can vary as well.

FIG. 3C illustrates a result 350 of determination of unique elements of the semi-structured data 302, as well of generation of a sequence of encoded representations corresponding to the semi-structured data 302 based on unique indexes of the unique elements. In some embodiments, the result 350 can be implemented as a compressed file. The result 350 can include a root pointer 352, an indication of values 354, and data stores 356, 358, and 360. However, it is noted that in other embodiments one or more elements of the result 350 can be omitted. For example, in some implementations the root pointer 352 and/or the indication of values 354 can be omitted. The data stores 356-360 can correspond to the data stores 332-336, respectively. As further discussed below, the result at the data store 356 includes the unique elements of the semi-structured data 302, where the unique elements are associated with unique indexes at the data store 356. The result 350 at the data store 358 can include the sequence of encoded representations of the semi-structured data 302, and the result 350 at the data store 360 can include a sequence of encoded representations of objects and/or arrays of the semi-structured data 302.

The data compression module can access each of the elements of the semi-structured data 302 and store each unique element at the atomic data store 356 (or another data store that stores unique elements of the semi-structured data). The data compression module can analyze various data types of the semi-structured data 302, including atomic elements at 304, objects at 306, and arrays at 308. The data store 356 can indicate an association between a respective unique index and a corresponding unique element stored at the atomic data store 356. The data compression module can store (or associate) at the data store 356, unique elements of the semi-structured data 302, and skip over any duplicative elements. The stored unique elements can include key and value each as a unique atomic entry. For example, when analyzing the key-value pair of 312 and 313, the data compression module can determine that the index of unique element 'a' at the atomic data store 356 is 0 and the index of the unique element of 123 is 1.

Once the data compression module analyzes the semi-structured data for unique elements, the data compression module can analyze and store object and array elements. In some embodiments, the data store 358 (referred to as the object data store 358) can store the object elements, and the data store 360 (referred to as the array data store 360) can store the array elements. In some embodiments, the data compression module can generate and store, in the objects data store 358, encoded representations for the entire semi-structured data 302 that was accessed to determine contents of the atomic data store 356.

To generate contents of the object data store 358, the data compression module can generate and store encoded representations for each of the key-value pairs of the semi-structured data 302. In some embodiments, the data compression module can also generate and store separate encoded representations for key-arrays and key-object pairs. FIG. 3C illustrates an example of generating encoded representations for the object data store 358 and for the array data store 360. The encoded representations for the object data store 358 and the array data store 360 can be based on indexes in the atomic data store 356.

The data compression module can generate encoded representations of the semi-structured data 302 based on indexes of the atomic elements in the data store 356, starting with the element a at index 0. However, other indexes and/or starting index positions are contemplated. The encoded representation can be implemented using a character encoding, such as by using Unicode characters based on 16-bit UTF-16.

In the example of FIG. 3C, the data compression module can generate and store the sequence of encoded representation of '$,048"@"D!H!' that corresponds to the entire semi-structured data 302. Index 0 of the atomic store can be encoded as a space, and index 1 can be encoded as $, thus corresponding to the key-value pair 312 and 313. Index 2 of the atomic data store 356 can be encoded as (, and index 3 of the atomic store 356 can be encoded as, character, thus corresponding to the key-value pair 314 and 315. The encoded representations for key-value pairs of 316 and 317 can be similarly generated. The data compression module can generate and encode the array element of 'a: 123' using '$', where index of 0 of the atomic store 356 can be encoded as a space in UTF-16, and index of 1 of the atomic store 356 can be encoded as $. In FIG. 3C, the encoded element of '$' is shown before the encoded representation of '$,048"@"D!H!', however, other orders of storing the encoded representations are contemplated.

For the objects 306, the key 318 of d can be stored, but its corresponding value 319 of 123, 'foo', 'bar' is not, as those are the three value for the keys a, b, and c, (which are already stored in the atomic data store 356) respectively. Similarly, for the arrays 308, the key 322 off can be stored, but its corresponding value 325 of a: 123 is not, as those are the key and value pair 312 and 313 (which is already stored in the atomic data store 356).

The data compression module can encode the array element of 'a: 123' to indicate that this object is repeated as at keys f and g. In some embodiments the data compression module does not generate separate encoded representation entries for objects and arrays of the semi-structured data 302, and instead stores all of the encoded representations at a single data store.

For the duplicate elements at keys d 318 and e 320, the data compression module can use indexes 6 and 8 of the atomic data store 356, which are encoded to UTF-16 characters of 8 and @ respectively. The array value for each of the keys d 318 and e 320 is the same, and it can be indexed to index 0 of the encoded representations at 358, encoded as UTF-16 character of ". For the duplicate elements of keys f 322 and g 324, the data compression module can use indexes 9 and 10 of the atomic data store 356, which are encoded to UTF-16 characters of D and H, respectively. The object value for each of the keys f 322 and g 324 is the same, and it can be indexed to index 0 of the object data store 358, pointing to the encoded array element of 'a: 123'. However in some embodiments, the data compression module can use a separate data store for encoding objects and/or arrays that are pointed to by encoded representations.

The data compression module can generate and encode the array values for keys d 318 and e 320 using the atomic data store 356. The data compression module can simply use the $4< to indicate index 1 of element 123 in the atomic data store 356, index 5 of element 'foo' in the atomic data store 356, and index 7 of element 'bar' in the atomic data store 356, respectively. Index 0 of the array store 360 array can be referenced by the values of keys d 318 and e 320 (i.e., by the encoded representations of !) at the object data store 358.

Once the data compression module generates and stores encoded representations at the data stores 358 and 360, the data compression module can serialize the encoded representations at the data stores 358 and 360, as well as the contents of the data store 356. The serializing can include flattening the contents of the data stores 356-360 into data that can be pointed to by a single pointer, such as the root pointer 352. The resultant serialized result can be stored or transmitted as a compressed file. The compressed file can then be decompressed, as discussed above.

It should be understood that FIGS. 1-3 and the operations described herein are examples meant to aid in understanding embodiments and should not be used to limit embodiments or limit scope of the claims. Embodiments may perform additional operations, fewer operations, operations in a different order, operations in parallel, and some operations differently. For example, one or more elements, steps, or processes described with reference to the diagrams of FIGS. 1-3 may be omitted, described in a different sequence, or combined as desired or appropriate.

As will be appreciated by one skilled in the art, aspects of the present disclosure may be embodied as a system, method, or computer program product. Accordingly, aspects of the present disclosure may take the form of an entirely hardware embodiment, a software embodiment (including firmware, resident software, micro-code, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible and/or non-transitory medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Computer program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The computer program code may execute (e.g., as compiled into computer program instructions) entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described with reference to flow diagram illustrations and/or block diagrams of methods, apparatus (systems) and computer program products according to embodiments of the present disclosure. It will be understood that each block of the flow diagram illustrations and/or block diagrams, and combinations of blocks in the flow diagram illustrations and/or block diagrams, can be implemented by computer program instructions. These computer program instructions may be provided to a processor of a general purpose computer, special purpose computer, or other programmable data processing apparatus to produce a machine, such that the computer program instructions, which execute via the processor of the computer or other programmable data processing apparatus, create means for implementing the functions/acts specified in the flow diagrams and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flow diagram and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flow diagrams and/or block diagram block or blocks.

Figure 4:
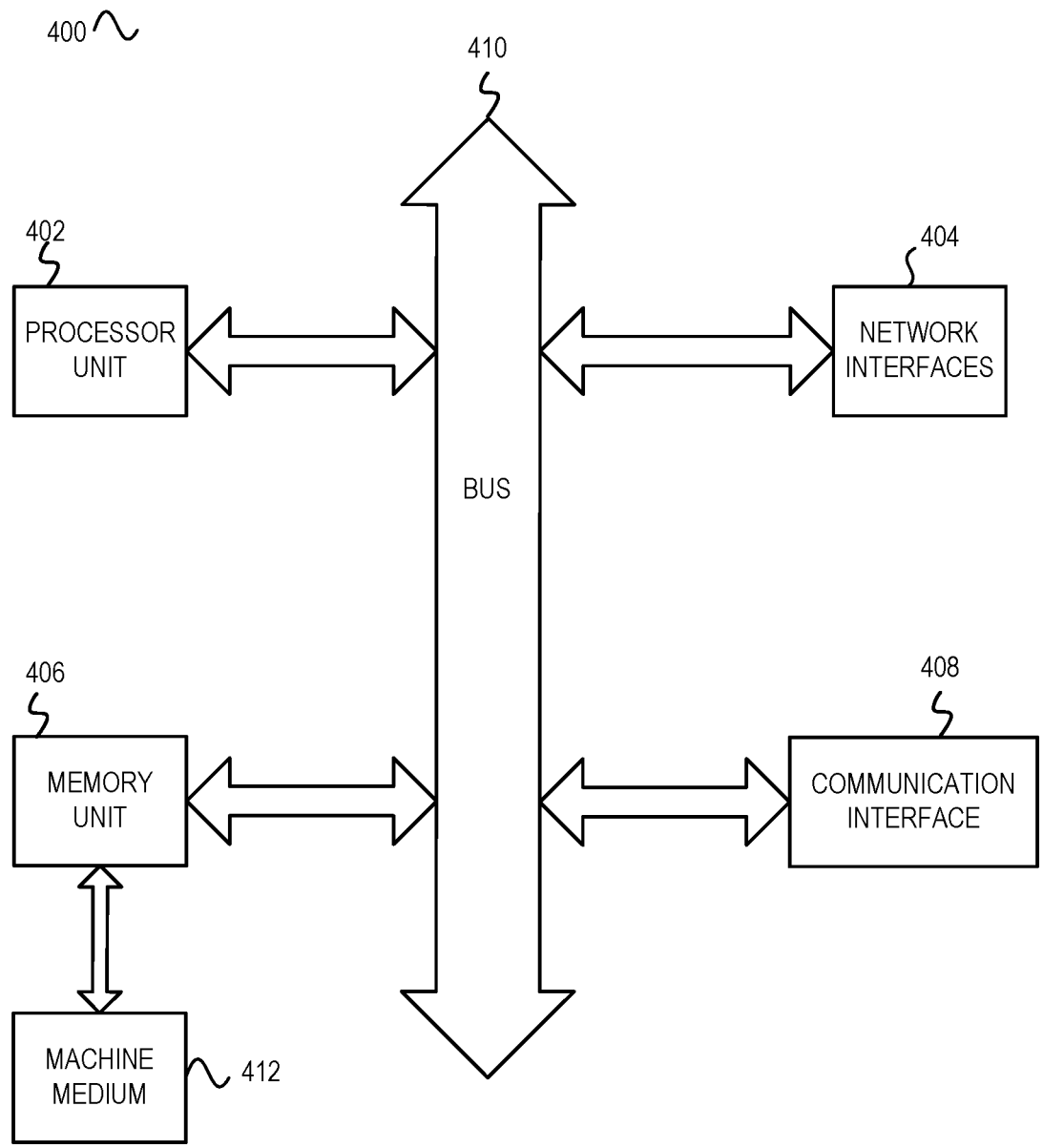
FIG. 4 is a block diagram of one embodiment of electronic device(s) used in the data compression system of FIG. 1.

FIG. 4 is a block diagram of one embodiment of electronic device(s) used in the data compression system of FIG. 1. FIG. 4 illustrates a block diagram of an exemplary embodiment of an electronic device 400 including a communication interface 408 for network communications. The electronic device can embody functionality to implement embodiments described in FIGS. 1-3 above. In some implementations, the electronic device 400 may be a laptop computer, a tablet computer, a mobile phone, a powerline communication device, a smart appliance (PDA), a server, and/or one or more another electronic systems. For example, a user device may be implemented using a mobile device, such as a mobile phone or a tablet computer. The electronic device 400 can include a processor unit 402 (possibly including multiple processors, multiple cores, multiple nodes, and/or implementing multi-threading, etc.). The electronic device 400 can also include a memory unit 406. The memory unit 406 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The electronic device 400 can also include the bus 410 (e.g., PCI, ISA, PCI-Express, Hyper-Transport®, InfiniBand®, NuBus, AHB, AXI, etc.), and network interfaces 404 can include wire-based interfaces (e.g., an Ethernet interface, a powerline communication interface, etc.). The communication interface 408 can include at least one of a wireless network interface (e.g., a WLAN interface, a Bluetooth interface, a WiMAX interface, a ZigBee interface, a Wireless USB interface, etc.), In some implementations, the electronic device 400 may support multiple network interfaces—each of which is configured to couple the electronic device 400 to a different communication network.

The memory unit 406 can embody functionality to implement embodiments described in FIGS. 1-3 above. In one embodiment, the memory unit 406 can include one or more of functionalities that facilitate compression (and decompression) of semi-structured data. Any one of these functionalities may be partially (or entirely) implemented in hardware and/or on the processor unit 402. For example, some functionality may be implemented with an application specific integrated circuit, in logic implemented in the processor unit 602, in a co-processor on a peripheral device or card, etc. Further, realizations may include fewer or additional components not illustrated in FIG. 4 (e.g., video cards, audio cards, additional network interfaces, peripheral devices, etc.). The processor unit 402, the memory unit 406, the network interface 404 and the communication interface 408 are coupled to the bus 410. Although illustrated as being coupled to the bus 410, the memory unit 406 may be coupled to the processor unit 402.

While the embodiments are described with reference to various implementations and exploitations, it will be understood that these embodiments are illustrative and that the scope of the present disclosure is not limited to them. In general, techniques for compressing/decompressing semi-structured data as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the present disclosure. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the present disclosure.

What is claimed is:

1. A method for compressing structured data, the method comprising:
   accessing semi-structured data, the semi-structured data comprising a plurality of elements that are grouped in key-value pairs;
   determining a plurality of unique elements of the plurality of elements that represent non-duplicate elements, each of the plurality of unique elements associated with a respective unique index of a plurality of unique indexes, each of the plurality of unique indexes indicating a position of a corresponding unique element of the plurality of unique elements in one of a plurality of data stores;
   determining a first array of elements from the plurality of elements, said determining the array comprising determining an arrangement of the plurality of unique elements; and
   generating a sequence of encoded representations corresponding to the plurality of elements, the sequence of encoded representations corresponding to at least some of the plurality of unique elements and the first array of elements, the generating the sequence of encoded representations based on the plurality of unique indexes.

2. The method of claim 1, further comprising:
   initializing the plurality of data stores; and
   storing indexes for elements of the semi-structured data.

3. The method of claim 1, wherein each of the plurality of data stores is associated with a different type of element.

4. The method of claim 1, wherein a first unique index of the plurality of unique indexes indicates a first type of element and an index into a first data store of the plurality of data stores.

5. The method of claim 1, further comprising:
storing a respective unique index or a reference to the respective unique index for each of the plurality of elements in a corresponding data store of the plurality of data stores.

6. The method of claim 1, further comprising:
serializing the sequence of encoded representations to generate compressed data.

7. The method of claim 6, further comprising:
generating a compressed file that comprises a plurality of encoded representations of the plurality of indexes mapped into the plurality of data stores.

8. The method of claim 7, further comprising:
de-duplicating the compressed file to obtain de-duplicated compressed file that includes de-duplicate representations.

9. The method of claim 7, further comprising:
creating a root pointer to the compressed file, the root pointer accessible from one of the plurality of data stores.

10. The method of claim 1, wherein each of the sequence of encoded representations is implemented by a respective unicode character, where at least some of the respective unicode characters indicate a corresponding one of the plurality of unique indexes.

11. A system comprising:
a non-transitory memory storing instructions; and
a processor configured to execute the instructions to cause the system to:
access semi-structured data, the semi-structured data comprising a plurality of elements that are grouped in key-value pairs;
determine a plurality of unique elements of the plurality of elements that represent non-duplicate elements, each of the plurality of unique elements associated with a respective unique index of a plurality of unique indexes, each of the plurality of unique indexes indicating a position of a corresponding unique element of the plurality of unique elements in one of a plurality of data stores;
determining a first array of elements from the plurality of elements, said determining the array comprising determining an arrangement of the plurality of unique elements; and
generate a sequence of encoded representations corresponding to the plurality of elements, the sequence of encoded representations corresponding to at least some of the plurality of unique elements and the first array of elements, the generating the sequence of encoded representations based on the plurality of unique indexes.

12. The system of claim 11, wherein executing the instructions further causes the system to:
initialize the plurality of data stores; and
store indexes for elements of the semi-structured data, wherein each of the plurality of data stores is associated with a different type of element.

13. The system of claim 11, wherein executing the instruction further causes the system to: store the respective unique index or a reference to the respective unique index for each of the plurality of elements in a corresponding data store of the plurality of data stores.

14. The system of claim 11, wherein executing the instructions further causes the system to,
serialize the sequence of encoded representations, wherein said serializing the sequence of encoded representations comprises generating a compressed file that comprises a plurality of encoded representations of the plurality of indexes mapped into the plurality of data stores.

15. The system of claim 11, wherein each of the sequence of encoded representations is implemented by a respective unicode character, where the respective unicode character indicates a corresponding one of a plurality of unique indexes.

16. A non-transitory machine-readable medium having instructions stored thereon, the instructions executable to cause performance of operations comprising:
accessing semi-structured data, the semi-structured data comprising a plurality of elements that are grouped in key-value pairs;
determining a plurality of unique elements of the plurality of elements that represent non-duplicate elements, each of the plurality of unique elements associated with a respective unique index of a plurality of unique indexes, each of the plurality of unique indexes indicating a position of a corresponding unique element of the plurality of unique elements in one of a plurality of data stores;
determining a first array of elements from the plurality of elements, said determining the array comprising determining an arrangement of the plurality of unique elements; and
generating a sequence of encoded representations corresponding to the plurality of elements, the sequence of encoded representations corresponding to at least some of the plurality of unique elements and the first array of elements, the generating the sequence of encoded representations based on the plurality of unique indexes.

17. The non-transitory machine-readable medium of claim 16, wherein the operations further comprise:
initializing the plurality of data stores; and
storing indexes for elements of the semi-structured data, wherein each of the plurality of data stores is associated with a different type of element.

18. The non-transitory machine-readable medium of claim 16, wherein the operations further comprise:
storing the respective unique index or a reference to the respective unique index for each of the plurality of elements in a corresponding data store of the plurality of data stores.

19. The non-transitory machine-readable medium of claim 16, wherein the operations further comprise:
serializing the sequence of encoded representations; and
generating a compressed file that comprises a plurality of encoded representations of the plurality of indexes mapped into the plurality of data stores.

20. The non-transitory machine-readable medium of claim 16, wherein each of the sequence of encoded representations is implemented by a respective unicode character, where the respective unicode character indicates a corresponding one of a plurality of unique indexes.

* * * * *